(12) United States Patent
McMillan et al.

(10) Patent No.: US 7,406,405 B2
(45) Date of Patent: Jul. 29, 2008

(54) METHOD AND SYSTEM FOR DESIGN VERIFICATION USING PROOF-BASED ABSTRACTION

(75) Inventors: Kenneth L. McMillan, Berkeley, CA (US); Nina Amla, Hoboken, NJ (US)

(73) Assignee: Cadence Design Systems, Inc., San Jose, CA (US)

(*) Notice: Subject to any disclaimer, the term of this patent is extended or adjusted under 35 U.S.C. 154(b) by 852 days.

(21) Appl. No.: 10/357,585

(22) Filed: Feb. 3, 2003

(65) Prior Publication Data
US 2004/0153308 A1 Aug. 5, 2004

(51) Int. Cl.
*G06F 17/10* (2006.01)
*G06F 9/45* (2006.01)
(52) U.S. Cl. .................. 703/2; 703/14; 716/4; 716/5
(58) Field of Classification Search ............. 703/2, 703/14; 716/5, 4
See application file for complete search history.

(56) References Cited

U.S. PATENT DOCUMENTS

| 5,440,568 | A | 8/1995 | Foster | |
|---|---|---|---|---|
| 2002/0138812 | A1 | 9/2002 | Johannsen | |
| 2003/0225552 | A1* | 12/2003 | Ganai et al. ............. | 703/2 |
| 2004/0019468 | A1 | 1/2004 | De Moura et al. | |

OTHER PUBLICATIONS

Li et al., A Satisfiability-Based Approach to Abstraction Refinement in Model Checking, Electronic Notes in Theoretical Computer Science, vol. 89, No. 4, 2003, pp. 608-622.*

Wing et al., A Case Study in Model Checking Software Systems, Science of Computer Programming, vol. 28, Nos. 2-3, Apr. 1997, pp. 273-299.*

Cabodi, Gianpiero et al., "Can BDDs Compete With SAT Solvers on Bounded Model Checking?", DAC 2002, Jun. 10-14, 2002, New Orleans, Louisiana, USA, Copyright 2002 ACM 1-58113-461-04/02/0006, Abstract.

Biere, Armin, "Verifying Sequential Behavior With Model Checking", Computer Systems Institute, ETH Zürich, Switzerland, Abstract.

Clarke, Edmund et al., "Bounded Model Checking Using Satisfiability Solving", Computer Science Department, CMU, Abstract.

A. Biere, C. Artho, V. Schuppan, "Liveness Checking as Safety Checking," Electronic Notes in Theoretical Computer Science 66 No. 2 (2002), 18 pages.

(Continued)

*Primary Examiner*—Russell Frejd
(74) *Attorney, Agent, or Firm*—Orion Law Group, PLC.; William E. Alford; Lawrence Lycke

(57) ABSTRACT

A design verifier includes a bounded model checker, an abstractor and an unbounded model checker. The bounded model checker verifies a property to a depth K and either finds a counterexample, or generates a proof in the form of a directed acyclic graph. If no counterexample is found, the abstractor generates an abstracted design description using a proof generated by the bounded model checker. The unbounded model checker verifies the property of the abstracted design description. If a counterexample is found, the bounded model checker increases K and verifies the property to the new larger depth. If no counterexample is found, the design is verified.

28 Claims, 4 Drawing Sheets

OTHER PUBLICATIONS

D. A. Plaisted, S. Greenbaum, "A Structure-preserving Clause Form Translation," J. Symbolic Computation (1986) 2, Academic Press Inc. (London Ltd.), pp. 293-304.

K. L. McMillan, N. Amla, "Automatic Abstraction with Counterexamples," Cadence Design Systems, LNCS 2619, 2003, pp. 2-17.

M. W. Moskewicz, C. F. Madigan, "Chaff: Engineering an Efficient SAT Solver," in Design Automation Conference, 2001, pp. 530-535.

P. Pudlak, "Lower Bounds for Resolution and Cutting Plane Proofs and Monotone Computations, "The Journal of Symbolic Logic, vol. 62, No. 3, Sep. 1997, pp. 981-998.

M. Sheeran, S. Singh, G. Stalmarck, "Checking Safety Properties Using Induction and a SAT-Solver," in Formal Methods in Computer Aided Design, 2000, pp. 108-125.

L. Zhang, S. Malik, "Validating SAT Solvers Using an Independent Resolution-Based Checker: Practical Implementations and Other Applications," In Date '03, pp. 880-885, 2003.

J. R. Burch, E. M. Clark, K. L. McMillan, D. L. Dill, "Sequential Circuit Verification Using Symbolic Model Checking," Proc. Design Automation Conf. Orlando, FL, Jun. 1990, pp. 46-51.

J. R. Burch, E. M. Clark, K. L. McMillan, D. L. Dill, L. J. Hwang, "Symbolic Model Checking: 1020 States and Beyond," in Proceedings of the Fifth Annual IEEE Symposium on Logic in Computer Science, pp. 1-33, Washington, D.C., 1990, IEEE Computer Society Press.

A. Gupta, Z. Yang, P. Ashar, A. Gupta, "SAT-Based Image Computation with Application in Reachability Analysis," in FMCAD 2000, pp. 354-371, 2000.

J. Baumgartner, A. Kuehlmann, J. Abraham, "Property Checking via Structural Analysis," in Computer-Aided Verification (CAV 2002), pp. 151-165.

A. Biere, A. Cimatti, E. Clark, Y. Zhu, "Symbolic Model Checking Without BDDs, "in TACAS '99, vol. 1579 of LNCS, pp. 193-207.

P. Bjesse, "Symbolic Model Checking With Sets of States Represented as Formulas," Technical Report CS-1999-100, Department of Computer Science, Chalmers Technical University, Mar. 1999, 17 pages.

P.A. Abdulla, P. Bjesse, N. Een, "Symbolic Reachability Anaysis Based on SAT-Solvers," in TACAS 2000, vol. 1785 of LNCS, Springer-Verlag, pp. 411-425.

P. Bjesse, T. Leonard, A. Mokkedem, "Finding Bugs in an Alpha Microprocessor Using Satisfiability Solvers," Chalmers University of Technology, Sweden, 2001, pp. 454-464.

R. Bryant, "Graph-Based Algorithms for Boolean Function Manipulation," IEEE Transactions on Computers, vol. C-35, No. 8, Aug. 1986, pp. 677-691.

O. Courdert, C. Berthet, J. C. Madre, "Verification of Synchronous Sequential Machines Based on Symbolic Execution," Bull Research Center, P.C. 58B, 68 Route de Versailles, 78430 Louveciennes, France, pp. 365-373.

F. Copty, L. Fix, R. Fraer, E. Giunchiglia, G. Kamhi, A. Tacchella, M. Y. Vardi, "Benefits of Bounded Model Checking at an Industrial Setting," Formal Property Verifications, Intel Corporation, Haifa, Israel, CAV 2001, LNCS 2102, 2001, pp. 436-453.

E. Goldberg, Y. Novikov, "Berkmin: a Fast and Robust Sat-Solver," 2002, pp. 142-149.

O. Kupferman, M.Y. Vardi, "Model Checking of Safety Properties," Formal Methods in System Design, 19, 2001, pp. 291-314.

J.P.M. Silva, K.A. Sakallah, "Grasp A New Search Algorithm for Satisfiability," 1996 IEEE, pp. 220-227.

M.Y. Vardi, P. Wolper, "An Automata-Theoric Approach to Automatic Program Verification (Preliminary Report)," IBM Research, AT&T Bell Laboratories, 1986 IEEE, pp. 332-344.

P.F. Williams, A. Biere, E.M. Clark, A. Gupta, "Combining Decision Diagrams and SAT pProcedures for Efficient Symbolic Model Checking," Semiconductor Research Corporation, CAV 2000, LNCS 1855, pp. 124-138.

W. Craig, "Linear Reasoning, A New Form of the Herbrand-Gentzen Theorem." Journal of Symbolic Logic, vol. 22, No. 3, Sep. 1957, pp. 250-268.

O. Lichtenstein, A. Pnueli, "Checking That Finite State Concurrent Programs Satisfy Their Linear Specification," Principles of Programming Languages (POPL 85), 1985, pp. 97-107.

A. Pnueli, L. Zuck, "Probabilistic Verification by Tableaux," Department of Computer Science, The Weizmann Institute of Science, Rehovot 76100, Israel, 1986 IEEE, pp. 322-331.

K.L. McMillan, "Interpolation and SAT-Based Model Checking," Cadence Berkeley Labs, CAV 2003, Jul. 8, 2003, 13 pages.

K.L. McMillan, "Symbolic Model Checking," Carnegie Mellon University, Kluwer Academic Publishers, 1993, pp. 25-39.

E.M. Clark, A. Biere, R, Raimi, Y. Zhu, "Bounded Model Checking Using Satisfiability Solving," Semiconductor Research Corporation, National Science Foundation, pp. 1-20.

A. Biere, A. Cimatti, E.M. Clark, O.F. Strichman, Y. Zhu, "Bounded Model Checking," Semiconductor Research Corporation, National Science Foundation, Army Research Office, Office of Naval Research, Naval Research Laboratory, 27 pages.

A. Biere, "Verifying Sequential Behavior with Model Checking," Computer Systems Institute, ETH Zurich, ETH Zentrum, RZ H, CH-8092 Zurich, Switzerland, 4 pages.

Cabodi, Gianpiero et al., "Can BDDs Compete With SAT Solvers on Bounded Model Checking?", Jun. 2002, Design Automation Conference, pp. 117-122.

McMillan et al., "Methods for Exploiting SAT Solvers in Unbounded Model Checking", Jun. 2003, First ACM and IEEE International Conference, pp. 135-142.

* cited by examiner

TO & FROM
LOCAL/WIDE AREA
NETWORK/INTERNET

METHOD AND SYSTEM FOR DESIGN VERIFICATION USING PROOF-BASED ABSTRACTION

FIELD OF THE INVENTION

Embodiments of the invention relate generally to design verification and more specifically but not exclusively to design verification using proofs generated from bounded model checkers.

BACKGROUND INFORMATION

In designing large dynamic systems such as, for example, a complex electronic circuit, the design is often analyzed to verify a selected property. For example, the design may need to be analyzed to verify that the system does not enter a certain state under any normal set of inputs to the system in any finite number of steps (e.g., a safety property).

One conventional approach is to use a bounded model checker that can verify whether the system will not enter a preselected state. For example, several Boolean satisfiability solvers (also referred to as SAT solvers) are known that can determine whether the system enters the state within a selected number of steps. Typically, the SAT solver searches for a counterexample (i.e., a set of inputs to the system that will cause the system to enter the preselected state within the selected number of steps). Thus, if the SAT solver finds a counterexample within K steps, the system can enter the preselected state. The designer can then redesign the system to ensure that the preselected state is not entered.

However, if the SAT solver cannot find a counterexample in K steps, there is a chance that the system will enter the preselected state in greater than K steps. Thus, the design is only partially verified for the selected property. This "partial" verification is unacceptable in many applications.

Another approach is to use an unbounded model checker that exhaustively calculates whether the system can enter the preselected state in any number of steps. However, this approach is only practical for relatively small systems because the number of states increases exponentially with the number of state variables (i.e., the so-called state explosion problem).

One modification of this approach is to use an abstraction of the design in the unbounded model checker. Subsequent abstractions are based on an analysis of the counterexample found in the previous iteration of the unbounded model checker. Typically, a constraint is introduced that prevents the counterexample from occurring. This approach tends to result in a relatively inefficient abstraction because the abstraction is an accumulation of the constraints introduced for each counterexample that was found in previous iterations. These added constraints may not be relevant to the preselected property, but there is no mechanism in this approach for removing an irrelevant constraint from the abstraction.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

In the following detailed description, numerous specific details are set forth. However, it is understood that embodiments of the invention may be practiced without these specific details. In other instances, well-known circuits, structures, and techniques have not been shown in detail in order to not obscure the understanding of this description. These embodiments are described in sufficient detail to enable those of ordinary skill in the art to practice the invention. The following detailed description is, therefore, not to be taken in a limiting sense, and the scope of the invention is defined only by the appended claims.

Figure 1:
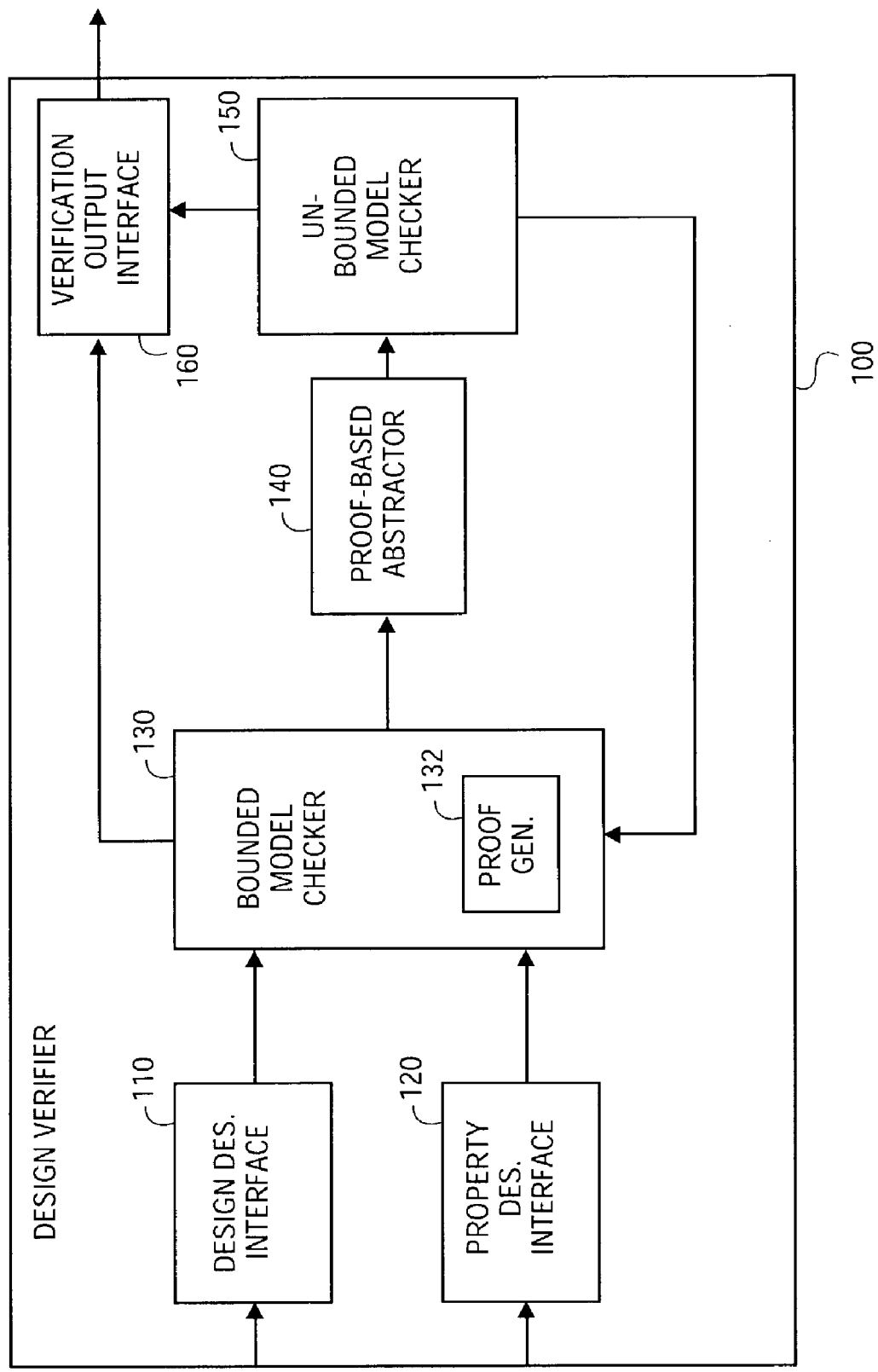
FIG. 1 is a block diagram illustrating modules implementing a design verifier according to one embodiment of the present invention.

FIG. 1 illustrates a design verifier 100 according to one embodiment of the present invention. In this embodiment, the design verifier is implemented using machine-readable instructions that cause a machine (e.g., a computer or work station) to perform operations that allow the machine to receive a design description of a system (e.g., a design description of an electronic circuit) and verify whether a property or properties of the design is satisfied.

In this embodiment, design verifier 100 includes modules implementing a design description interface 110, a property description interface 120, a bounded model checker 130 having a proof generator 132, a proof-based abstractor 140, an unbounded model checker 150 (also referred to herein as a standard model checker) and a verification output interface 160. In one embodiment, these modules are implemented using machine-readable instructions.

Design description interface 110 and property description interface 120, in this embodiment, are configured to receive Boolean design and property descriptions from a source(s) external to the interfaces (e.g., a file) and to provide output to bounded model checker 130. Bounded model checker 130 is configured to provide output to proof-based abstractor 140, which in turn is configured to provide output to standard model checker 150. Standard model checker 150 is configured to provide output to bounded model checker 140 and to verification output interface 160. Verification output interface 160 is also configured to receive output from bounded model checker 130. The operational flow of design verifier 100 is described below.

Figure 2:
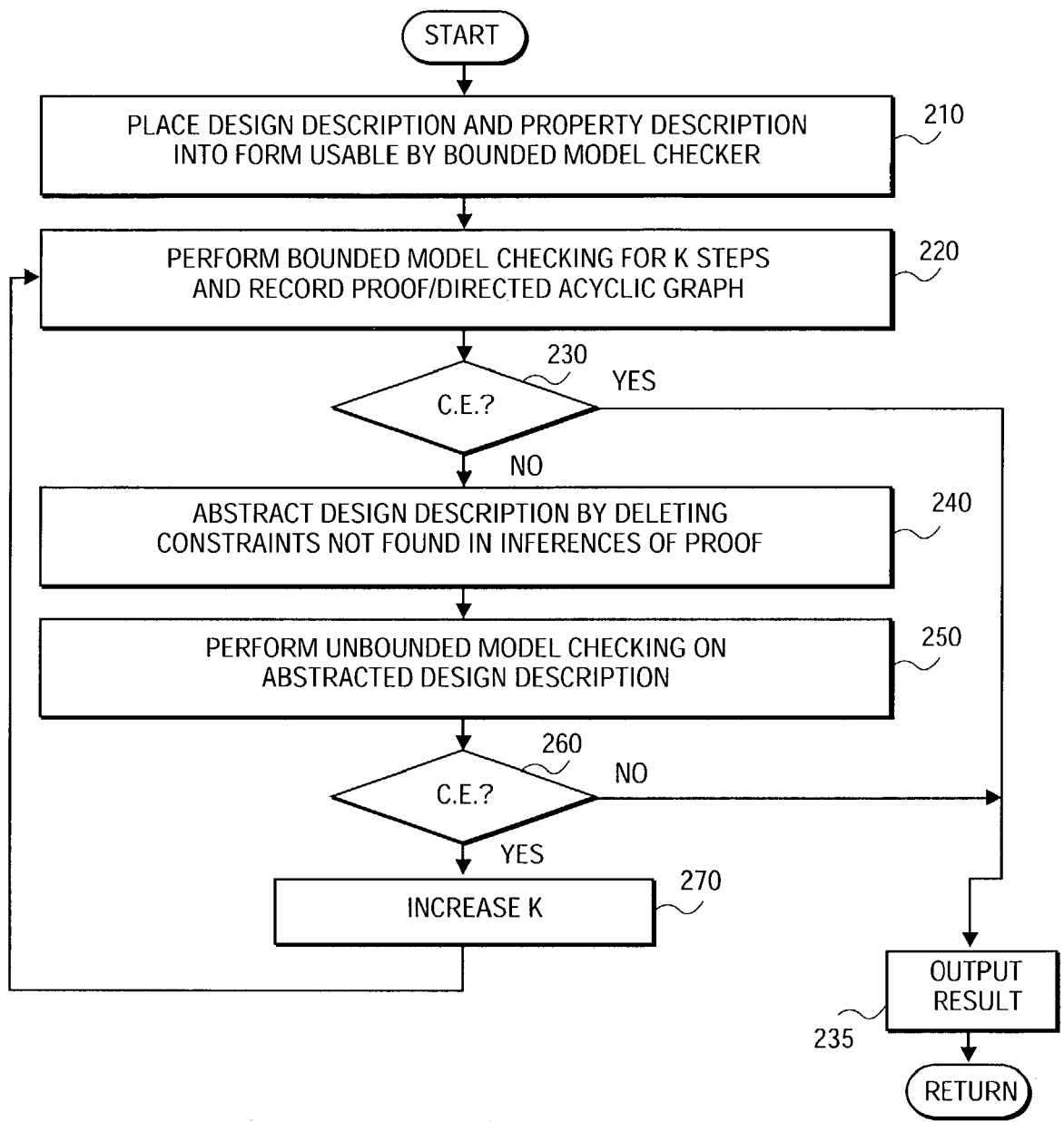
FIG. 2 is a flow diagram illustrating an operational flow of the design verifier of FIG. 1, according to one embodiment of the present invention.

FIG. 2 illustrates an operational flow of design verifier 100 (FIG. 1), according to one embodiment of the present invention. Referring to FIGS. 1 and 2, design verifier 100 operates as follows.

In a block 210, Boolean design and property descriptions are placed into a form that is usable by bounded model checker 130. In this embodiment, design description interface 110 and property description interface 120 are configured to transform the Boolean descriptions into a form usable by bounded model checker 130. For example, interfaces 110 and 120 can receive a file or files containing the Boolean design and property descriptions and output a series of constraints over variables representing the design state. In a typical application, each variable represents the current electrical state of a wire or node in a digital circuit, or its subsequent state after one step, or clock cycle. Each constraint typically represents the action of a single gate or register in the design. Additional constraints are generated to characterize the initial state (typically the reset state of a circuit) and the final state (i.e., the state that violates the given property).

In this embodiment, a constraint is a Boolean formula. In addition, the constraints may be transformed into conjunctive normal form (CNF) in order to provide suitable input for bounded model checker 130. A formula in CNF is a conjunction (logical AND) of clauses. Each clause is in turn a disjunction (logical OR) of literals. Each literal is either a variable or its negation (logical NOT). In some alternative embodiments, the functions of design description interface 110 and property description interface 120 are combined in a single module.

In a block 220, bounded model checker 130 performs a bounded model checking algorithm on the transformed design and property description to a depth of K steps. In one embodiment, bounded model checker 130 has a component that is substantially similar to a conventional SAT solver. In performing the bounded model checking, bounded model checker 130 outputs one of two results: an indication that the property is true for all design behaviors up to K steps (i.e., no counterexample was found), or an indication that the property may be false within K steps (i.e., a counterexample was found). If no counterexample was found, bounded model checker 130 by itself cannot determine whether no counterexamples would exist if the process were carried out for greater than K steps.

In addition, bounded model checker 130 includes proof generator 132 that is configured to record the inferences generated by the bounded model checker 130 (described in more detail below in conjunction with FIG. 3). In one embodiment, a conventional SAT solver within the bounded model checker is modified to store the inferences it generates during the phase known as conflict clause generation. Other embodiments use different bounded model checkers that generate inferences that can be recorded.

In a decision block 230, the result from the bounded model checking is analyzed to determine if bounded model checker 130 found a counterexample. If a counterexample was found in K steps, the operational flow effectively terminates because the design was found to have an error. In a block 235, this indication can be provided to the operator via verification output interface 160. This information can then be passed to the designers for redesign as desired. However, if no counterexample was found in K steps, the operational flow proceeds to a block 240.

In block 240, the design description is abstracted using the proof recorded by proof generator 132. In this embodiment, proof-based abstractor 140 abstracts the design description by deleting all constraints not involved in any of the inferences of the recorded proof. More particularly, abstractor 140 deletes any constraint having none of its clauses present in any inference step. Note that a bounded model checker replicates the clauses of the transformed design description K times. Thus, a constraint will be said to be present in the proof if any instance of one of its clauses is present. The abstracted design description can have a significantly smaller number of constraints relative to the full design description from block 210.

It can be shown that this type of abstraction will not invalidate the proof and thus the abstracted design description is also guaranteed to have no counterexample in K steps (or fewer). One way to think of this attribute of the abstraction is that the deleted constraints were not relevant to the property that is being verified, at least within K steps. Thus, if K is large enough, it is reasonable to expect that removing these constraints will have no effect on the truth of the property in general.

In block 250, unbounded model checking is performed on the abstracted design description. In this embodiment, a conventional binary decision diagram (BDD)-based model checker 150 performs the unbounded model checking on the abstracted design description. Because the abstracted design description typically has significantly fewer constraints, containing significantly fewer variables, the unbounded model checking may be reduced in run time by several orders of magnitude. This makes it possible to verify designs that it would otherwise be impractical to verify using currently available computers. The reduction in variables helps avoid the aforementioned state explosion problem that conventional standard model checking approaches encounter. In several benchmark tests, the standard model checker was always able to complete processing when the bounded model checker could complete.

In a decision block 260, the output from standard model checker 150 is analyzed to determine if standard model checker 150 found a counterexample. Standard model checker 150 also outputs one of two possible results. If it finds no counterexample, then the property is considered verified and the design is "good". In particular, it can be shown that finding no counterexample in the abstracted design description is equivalent to finding no counterexample in the full design description from block 210. Furthermore, because an exhaustive model checking algorithm was used, the verification applies for all K, unlike the bounded model checking of block 220 that verifies for only a fixed value of K. The operational flow proceeds to block 235 in which this indication can then be provided to the operator via verification output interface 160.

If on the other hand, standard model checker 150 finds a counterexample, because the standard model checking was performed on an abstraction, the counterexample may not be a true indication of that the design has an error. However, the fact that the counterexample was found can be used in a next iteration of the process. As previously stated, the abstracted design description is guaranteed to have no counterexample in K or fewer steps. Thus, the counterexample will be found at a number of steps that is greater than the current value of K. Further, it can be shown that if the counterexample was found in the (K+J)th step, then the full design description will have no counterexample in less than K+J steps.

In a decision block 270, K is increased. In this embodiment, K is increased to the number of steps needed to find the counterexample. In other embodiments, K can be increased to another value. Bounded model checker 130 is configured to use the value received from standard model checker 150 as the new value of K. The operational flow returns to block 220 for bounded model checking using this new larger value of K. The process will repeat until either a counterexample is found in block 220 or no counterexample is found in block 250. It can be shown that this process must eventually terminate. In particular, it must terminate when the value of K is becomes greater than the depth of the state space of the abstraction. However, it may terminate before this point.

Figure 3:
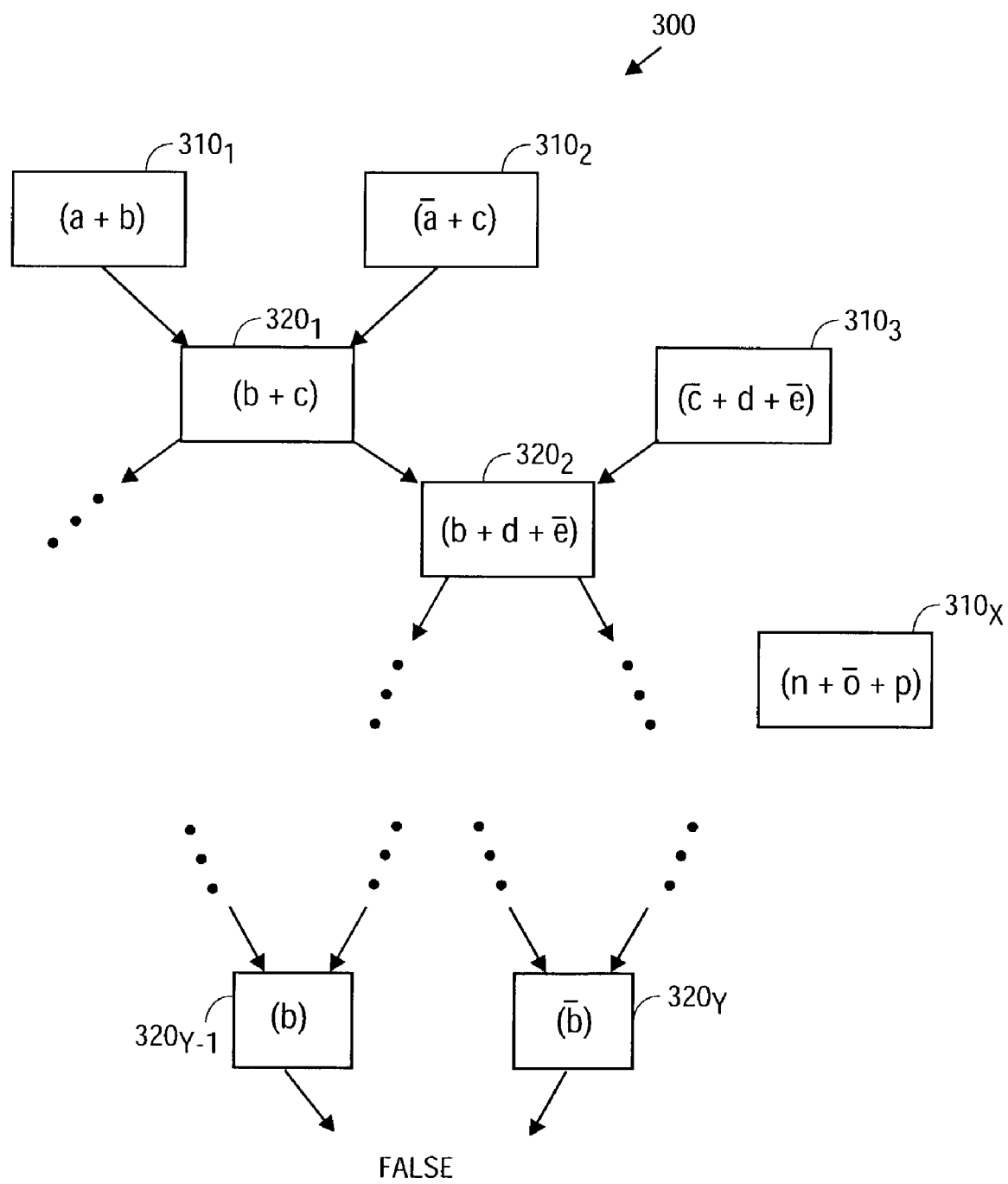
FIG. 3 is a diagram illustrating a proof generated by the bounded model checker of FIG. 1, according to one embodiment of the present invention.

FIG. 3 illustrates a proof 300 generated by bounded model checker 130 (FIG. 1) when no counterexample is found in K steps, according to one embodiment of the present invention. In this embodiment, proof 300 is in the form of a directed acyclic graph (DAG). The proof uses clauses $310_1, 310_2, \ldots, 310_x$, each of which is derived from some constraint in the transformed design description.

For example, clause $310_1$ is (a+b), clause $310_2$ is ($\bar{a}$+c), and clause $310_x$ is (n+$\bar{o}$+p). Bounded model checker 130 infers clauses $320_1, 320_2, \ldots, 320_y$, from these clauses and those previously inferred. In this example, inference clause $320_1$ is (b+c), generated by taking the resolvent of constraint clauses $310_1$ and $310_2$. Similarly, inference clause $320_2$ is generated by taking the resolvent of inference clause $320_1$ and constraint clause $310_3$. This process of taking the resolvent of constraint and/or inference clauses is continued, resulting in the last two clauses $320_{y-1}$ and $320_y$. In this example, the last two clauses $320_{y-1}$ and $320_y$ are unsatisfiable (i.e., the literals b and b complement cannot both be true), indicating that no counterexample exists in K steps. In this example, the clause $310_x$ is not used in any of the inferences of proof 300, and thus the constraint containing it can be eliminated by abstractor 140 (FIG. 1) during performance of block 240 (FIG. 2). This may in turn eliminate variables n, o and p from the abstracted design description.

Figure 4:
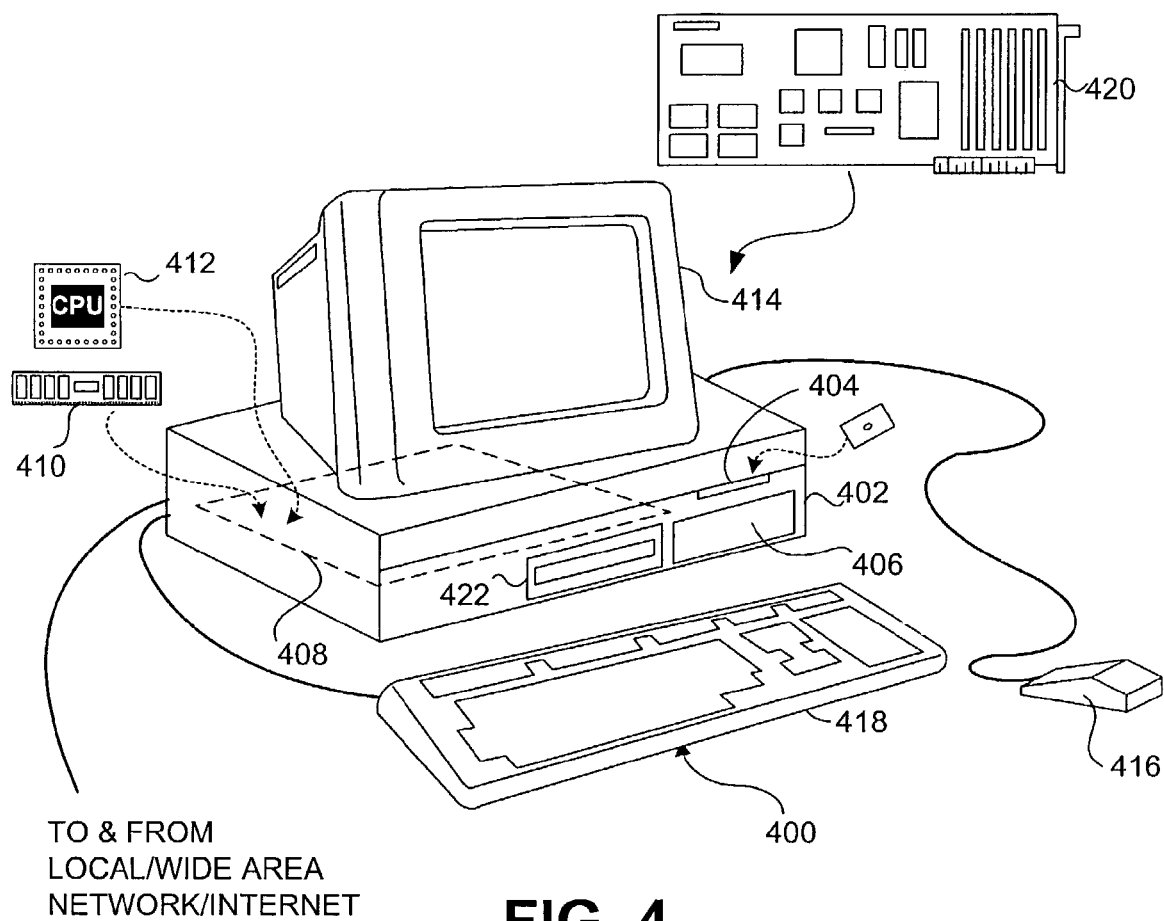
FIG. 4 is a diagram illustrating an exemplary computer for use with embodiments of the present invention.

FIG. 4 illustrates a generally conventional computer 400, which is suitable for use as client machines, application servers, and database servers in connection with practicing the present invention. Computer 400 may be used for running client and server-side software that includes one or more software modules that implement the various operations of the invention discussed above. Examples of computers that may be suitable for client machines as discussed above include (but are not limited to) PC-class systems operating the Windows operating systems, workstations (e.g., Sun workstations) operating a UNIX-based operating system (e.g., the Solaris operating system), and various computer architectures that implement LINUX operating systems. Computer 400 is also intended to encompass various server architectures, as well as computers having multiple processors.

In this embodiment, computer 400 includes a processor chassis 402 in which are mounted a floppy disk drive 404, a hard drive 406, a motherboard 408 populated with appropriate integrated circuits including memory 410 and one or more processors (CPUs) 412, and a power supply (not shown), as are generally well known to those of ordinary skill in the art. It will be understood that hard drive 406 may be implemented as a single unit, or multiple hard drives, and may optionally reside outside of computer 400. A monitor 414 is included for displaying graphics and text generated by software programs and program modules that are run by the computer. A mouse 416 (or other pointing device) may be connected to a serial port (or to a bus port or USB port) on the rear of processor chassis 402. Signals from mouse 416 are conveyed to the motherboard to control a cursor on the display and to select text, menu options, and graphic components displayed on monitor 414 by software programs and modules executing on the computer. In addition, in this embodiment, a keyboard 418 is coupled to the motherboard for user entry of text and commands that affect the running of software programs executing on the computer. In this exemplary embodiment, computer 400 also includes a network interface card 420 or built-in network adapter for connecting the computer to a computer network, such as a local area network, wide area network, or the Internet.

Embodiments of computer 400 may also optionally include a compact disk-read only memory (CD-ROM) drive 422 into which a CD-ROM disk may be inserted so that executable files and data on the disk can be read for transfer into the memory and/or into storage on hard drive 406 of computer 400. Other mass memory storage devices such as an optical recorded medium or DVD drive may be included. The machine readable instructions comprising the software that causes computer 400 to implement the functions of the present invention can be distributed on floppy disks or CD-ROMs (or other memory media) and stored in the hard drive until loaded into random access memory (RAM) for execution by the CPU. Optionally, all or a portion of the machine instructions may be loaded via a computer network.

Embodiments of a design verifier using proof-based abstraction are described herein. In the above description, numerous specific details are set forth (such as the SAT solver, unbounded model checker, etc.) to provide a thorough understanding of embodiments of the invention. One skilled in the relevant art will recognize, however, that embodiments of the invention can be practiced without one or more of the specific details, or with other methods, components, materials, etc. In other instances, well-known structures, materials, or operations are not shown or described in detail to avoid obscuring the description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In addition, embodiments of the present description may be implemented not only within a semiconductor chip but also within machine-readable media. For example, the designs described above may be stored upon and/or embedded within machine readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above.

Thus, embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium can include such as a read only memory (ROM); a random access memory (RAM); a magnetic disk storage media; an optical storage media; and a flash memory device, etc.

The above description of illustrated embodiments of the invention, including what is described in the Abstract, is not intended to be exhaustive or to be limitation to the precise forms disclosed. While specific embodiments of, and examples for, the invention are described herein for illustrative purposes, various equivalent modifications are possible, as those skilled in the relevant art will recognize.

These modifications can be made to embodiments of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. A method for verifying a property of a design of a system, the method comprising:
   performing bounded model checking on a design description for the system to a depth of K steps, the design description including a plurality of constraints referring to states of components within the system, each constraint including at least one variable;
   abstracting the design description responsive to a proof generated in performing the bounded model checking when no counterexample of depth K is found in performing the bounded model checking, the proof including at least one inference derived from a constraint of the plurality of constraints, each inference including at least one variable;
   performing an unbounded model checking on the abstracted design description; and
   outputting a result response to the unbounded model checking.

2. The method of claim 1, further comprising performing bounded model checking with an increased value of K when the unbounded model checking finds a counterexample.

3. The method of claim 2, wherein the value of K is increased to a depth at which the unbounded model checking found the counterexample.

4. The method of claim 1, further comprising transforming the design description to include a plurality of constraints in conjunctive normal form.

5. The method of claim 4, wherein abstracting the design description comprises deleting a constraint of the design description when the constraint's clauses are not used in any inference step of the proof.

6. The method of claim 1, wherein a Boolean satisfiability solver is used in performing the bounded model checking.

7. The method of claim 1, wherein performing an unbounded model checking comprises using a binary decision diagram (BDD)-based model checker.

8. An apparatus for verifying a property of a circuit design for a system, the apparatus comprising:
   one or more processors executing machine readable instructions stored in a machine readable medium to verify the property of the circuit design, including:
   instructions for performing bounded model checking on a design description for the system to a depth of K steps, the design description including a plurality of constraints referring to states of components within the system, each constraint including at least one variable;
   instructions for abstracting the design description responsive to a proof generated in performing the bounded model checking when no counterexample of depth K is found in performing the bounded model checking, the proof including at least one inference derived from a constraint of the plurality of constraints, each inference including at least one variable;
   instructions for performing unbounded model checking on the abstracted design description; and
   instructions for outputting a result responsive to the unbounded model checking.

9. The apparatus of claim 8 wherein the value of K is increased if a counterexample is found.

10. The apparatus of claim 9 wherein the value of K is increased to a depth where the counterexample is found.

11. The apparatus of claim 8, wherein the instructions stored in the machine readable medium to verify the property of the circuit design further include instructions for transforming the design description to include a plurality of constraints in conjunctive normal form.

12. The apparatus of claim 11 wherein the instructions for abstracting the design description include instructions for deleting a constraint of the design description when the constraint's clauses are not used in any inference step of the proof.

13. The apparatus of claim 8, wherein the instructions for performing bounded model checking include instructions to provide a Boolean satisfiability solver.

14. The apparatus of claim 8, wherein the instructions for performing unbounded model checking include instructions to provide a binary decision diagram (BDD)-based model checker.

15. A machine readable storage media having stored therein instructions that when executed by a machine causes the machine to perform operations comprising:
   performing bounded model checking on a design description of a system to a depth of K steps, the design description including a plurality of constraints referring to states of components within the system, each constraint including at least one variable;
   abstracting the design description responsive to a proof generated in performing the bounded model checking when no counterexample of depth K is found in performing the bounded model checking, the proof including at least one inference derived from a constraint of the plurality of constraints, each inference including at least one variable;
   performing an unbounded model checking on the abstracted design description; and
   outputting a result responsive to the unbounded model checking.

16. The machine readable media of claim 15, further comprising instructions that when executed by the machine causes the machine to perform operations comprising:
   performing bounded model checking with an increased value of K when the unbounded model checking finds a counterexample.

17. The machine readable media of claim 16, wherein the value of K is increased to a depth at which the unbounded model checking found the counterexample.

18. The machine readable media of claim 15, further comprising instructions that when executed by the machine causes the machine to perform operations comprising:
   transforming the design description to include constraints in conjunctive normal form.

19. The machine readable media of claim 18, wherein abstracting the design description comprises deleting a constraint of the design description when the constraint's variables are not contained in any inference of the proof.

20. The machine readable media of claim 15, wherein a Boolean satisfiability solver is used in performing the bounded model checking.

21. The machine readable media of claim 15, wherein performing an unbounded model checking comprises using a binary decision diagram (BDD)-based model checker.

22. A machine-readable media having machine-executable modules stored therein which when executed causes a machine to perform operations for verifying a property of a design for a system, the modules comprising:
   a bounded model checker having a proof generator to verify a property of a design description to a depth of K steps, the design description including a plurality of constraints referring to states of components within the system, each constraint including at least one variable; and an abstractor to provide an abstracted design description related to the design description using on a proof generated by the proof generator when the bounded model checker finds no counterexample in K steps, the proof including at least one inference derived from a constraint of the plurality of constraints, each inference including at least one variable; and an unbounded model checker to verify the property of the abstracted design description, wherein the unbounded model checker is to output a result.

23. The machine-readable media of claim 22 wherein the bounded model checker is to verify a property of a design description to a depth of K+J steps when the unbounded model checker finds a counterexample in verifying the property of the abstracted design description.

24. The machine-readable media of claim 23 wherein K+J is equal to the depth of counterexample found by the unbounded model checker.

25. The machine-readable media of claim 22 wherein the bounded model checker comprises a Boolean satisfiability solver.

26. The machine-readable media of claim 22 wherein the unbounded model checker comprises a binary decision diagram (BDD)-based model checker.

27. The machine-readable media of claim 22, wherein the modules further comprise an interface to transform a Boolean design description to include constraints in conjunctive normal form.

28. The machine-readable media of claim 27 wherein the abstractor to delete a constraint of the design description when the constraint's clauses are not used in any inference step of the proof.

* * * * *